(12) United States Patent
Yadid et al.

(10) Patent No.: US 12,293,936 B2
(45) Date of Patent: May 6, 2025

(54) SECURING A WAFER TO A CHUCK (71) Applicant: Applied Materials Israel Ltd., Rehovot (IL)

(72) Inventors: Dekel Yadid, Rehovot (IL); Eytan Hendel, Rehovot (IL)

(73) Assignee: Applied Materials Israel Ltd., Rehovot (IL)

( * ) Notice: Subject to any disclaimer, the term of this patent is extended or adjusted under 35 U.S.C. 154(b) by 347 days.

(21) Appl. No.: 18/106,324

(22) Filed: Feb. 6, 2023

(65) Prior Publication Data
US 2024/0266204 A1 Aug. 8, 2024

(51) Int. Cl.
*H01L 21/683* (2006.01)
*H01L 21/68* (2006.01)
*H01L 21/687* (2006.01)

(52) U.S. Cl.
CPC .......... *H01L 21/6838* (2013.01); *H01L 21/68* (2013.01); *H01L 21/68764* (2013.01)

(58) Field of Classification Search
CPC ................. H01L 21/6838; H01L 21/68; H01L 21/68764; H01L 21/67288
See application file for complete search history.

(56) References Cited

U.S. PATENT DOCUMENTS

2019/0259648 A1* 8/2019 Yudovsky ........... H01L 21/6838

FOREIGN PATENT DOCUMENTS

WO WO-2010071274 A1 * 6/2010 ......... H01L 21/6838

* cited by examiner

*Primary Examiner* — Jason L Vaughan
*Assistant Examiner* — Amanda Kreiling
(74) *Attorney, Agent, or Firm* — Kilpatrick Townsend & Stockton LLP (57) ABSTRACT

A system that includes a vacuum module that includes a first vacuum source, a first vacuum propagation path, a second vacuum source, and a second vacuum propagation path. The first vacuum source is configured to provide first vacuum of a first vacuum level, via the first vacuum propagation path, to a chuck. The chuck is mounted on a mechanical stage. The second vacuum source is configured to provide second vacuum at a second vacuum level, via the second vacuum propagation path, to the chuck. The second vacuum level exceeds the first vacuum level. The chuck is configured to apply at least one of the first vacuum or the second vacuum to the wafer. The first vacuum propagation path is configured to follow movements of the chuck. The second vacuum propagation path is configured to remain static despite the movements of the chuck.

19 Claims, 10 Drawing Sheets

| Receiving, by the chuck, first vacuum; wherein the first vacuum (i) exhibits a first vacuum level, (ii) was generated by a first vacuum source, and (iii) passed through a first vacuum propagation path before reaching the chuck. The first vacuum source is external to a mechanical stage on which the chuck is mounted. 110 | Receiving, by the chuck, second vacuum; wherein the second vacuum (i) exhibits a second vacuum level that exceeds the first vacuum level, (ii) was generated by a second vacuum source, and (iii) passed through a second vacuum propagation path before reaching the chuck. The second vacuum source is external to a mechanical stage on which the chuck is mounted. 120 |
|---|---|
| Securing the wafer to the chuck by applying at least the first vacuum on the wafer. 120 | Securing the wafer to the chuck by applying at least the second vacuum on the wafer. 140 |

SECURING A WAFER TO A CHUCK

BACKGROUND

Wafer evaluation systems for evaluating a wafer may include inspection systems, review systems, and metrology systems.

The wafer may be moved during the inspection in order to allow the evaluation system to evaluate different parts of the wafer. The wafer may be positioned on a chuck and the chuck may be moved during the inspection, while the wafer is secured to the chuck.

Chucks may apply vacuum on the wafer in order to secure the wafer to the chuck, even during movement and when the chuck is static.

A securing of the wafer to the chuck is less effective when the wafer is wrapped.

There is a growing need to provide a solution for securing a wafer to the chuck even when the wafer is warped.

SUMMARY

There may be provided a system for securing a wafer to a chuck, the system includes a vacuum module. The vacuum module may include a first vacuum source, a first vacuum propagation path, a second vacuum source, and a second vacuum propagation path. The first vacuum source is configured to provide first vacuum of a first vacuum level, via the first vacuum propagation path, to a chuck that is mounted on a mechanical stage. The first vacuum source is external to the mechanical stage. The second vacuum source is configured to provide second vacuum at a second vacuum level, via the second vacuum propagation path, to the chuck. The second vacuum source is external to the mechanical stage. The second vacuum level exceeds the first vacuum level. The chuck is configured to apply the at least one of the first vacuum or the second vacuum to the wafer. The first vacuum propagation path is configured to follow movements of the chuck. The second vacuum propagation path is configured to remain static despite the movements of the chuck.

There may be provided a method for securing a wafer to a chuck, the method may include (a) receiving, by the chuck, first vacuum; wherein the first vacuum (i) exhibits a first vacuum level, (ii) was generated by a first vacuum source, and (iii) passed through a first vacuum propagation path before reaching the chuck; wherein the first vacuum source is external to a mechanical stage on which the chuck is mounted; (b) securing the wafer to the chuck by applying at least the first vacuum on the wafer; (c) receiving, by the chuck, second vacuum; wherein the second vacuum (i) exhibits a second vacuum level that exceeds the first vacuum level, (ii) was generated by a second vacuum source, and (iii) passed through a second vacuum propagation path before reaching the chuck; wherein the second vacuum source is external to the mechanical stage; and (d) securing the wafer to the chuck by applying at least the second vacuum on the wafer. The first vacuum propagation path follows movements of the chuck, wherein the second vacuum propagation path remains static despite the movements of the chuck.

BRIEF DESCRIPTION OF THE DRAWINGS

The subject matter regarded as the embodiments of the disclosure is particularly pointed out and distinctly claimed in the concluding portion of the specification. The embodiments of the disclosure, however, both as to organization and method of operation, together with objects, features, and advantages thereof, may best be understood by reference to the following detailed description when read with the accompanying drawings in which:

DETAILED DESCRIPTION

In the following detailed description, numerous specific details are set forth in order to provide a thorough understanding of the embodiments of the disclosure.

However, it will be understood by those skilled in the art that the present embodiments of the disclosure may be practiced without these specific details. In other instances, well-known methods, procedures, and components have not been described in detail so as not to obscure the present embodiments of the disclosure.

The subject matter regarded as the embodiments of the disclosure is particularly pointed out and distinctly claimed in the concluding portion of the specification. The embodiments of the disclosure, however, both as to organization and method of operation, together with objects, features, and advantages thereof, may best be understood by reference to the following detailed description when read with the accompanying drawings.

It will be appreciated that for simplicity and clarity of illustration, elements shown in the figures have not necessarily been drawn to scale. For example, the dimensions of some of the elements may be exaggerated relative to other elements for clarity. Further, where considered appropriate, reference numerals may be repeated among the figures to indicate corresponding or analogous elements.

Because the illustrated embodiments of the disclosure may for the most part, be implemented using electronic components and circuits known to those skilled in the art, details will not be explained in any greater extent than that considered necessary as illustrated above, for the understanding and appreciation of the underlying concepts of the present embodiments of the disclosure and in order not to obfuscate or distract from the teachings of the present embodiments of the disclosure.

The term "and/or" means additionally or alternatively. Thus "A and/or B" may mean only A, or may mean only B, or may mean A and B.

There is provided a method and a system for securing a wafer to a chuck in a highly efficient manner. The securing of the wafer is done by providing one or more vacuums of different vacuum levels from different vacuum sources that are independently controlled.

The vacuum is provided via different vacuum conductive paths. The different vacuum sources are external to the mechanical stage—so that the mechanical stage does not need to carry vacuum sources such as vacuum reservoirs— thereby reducing the complexity and/or cost and/or mechanical load imposed on the stage.

The different vacuum conductive paths may differ from each other by one or more parameters—such as length and/or vacuum losses and/or movability—thereby allowing to allocate the shorter and/or less vacuum lossy and/or more static vacuum conductive path to convey vacuum of higher vacuum level (less pressure) to the chuck.

At one or more points in time vacuum from a single vacuum source may be provided.

At one or more other points in time the chuck may receive vacuum from any combination or sub-combination of the different vacuum sources.

The vacuum may be provided to the chuck during different periods—for example during a wafer straightening period in which the wafer is straightened—and/or after the wafer straightening period—during a wafer secure maintaining period—in which the wafer is secured to the chuck after being straightened.

Any combinations of one more vacuum sources may participate in the provision of vacuum during the wafer straightening period and/or after the wafer straightening period and/or during a wafer secure maintaining period.

The vacuum level that may be required to initially straighten the wafer may exceed the vacuum level that may be required to maintain a straightened wafer secured to the chuck.

The following examples refer to a first vacuum source and a second vacuum source—but there may be more than two different vacuum sources.

The following examples refer to a first vacuum propagation path and a second vacuum propagation path—but there may be more than two different vacuum propagation paths.

The following examples refer to a first vacuum level and a second vacuum level—but there may be more than two different vacuum levels.

There is provided a system for securing a wafer to a chuck, the system may include a vacuum module.

The vacuum module may include a first vacuum source, a first vacuum propagation path, a second vacuum source, and a second vacuum propagation path.

Any vacuum propagation path may include one or more vacuum conduits—such as one or more vacuum cables and/or one or more vacuum recesses, and/or one or more vacuum openings, and the like.

The first vacuum source may be configured to provide first vacuum of a first vacuum level, via the first vacuum propagation path, to a chuck that is mounted on a mechanical stage. The first vacuum source is external to the mechanical stage.

The second vacuum source may be configured to provide second vacuum at a second vacuum level, via the second vacuum propagation path, to the chuck. The second vacuum source is external to the mechanical stage. The second vacuum level exceeds the first vacuum level.

The chuck is configured to apply the first vacuum and/or the second vacuum to the wafer.

For example—the chuck may receive at one or more points in time only the first vacuum—and apply only the first vacuum.

Yet for another example—the chuck may receive at one or more other points in time only the second vacuum and apply only the second vacuum.

A further example—the chuck may receive at one or more further points in time the first vacuum and the second vacuum—and apply the first vacuum and the second vacuum.

The first vacuum propagation path is configured to follow movements of the chuck. The second vacuum propagation path is configured to remain static despite the movements of the chuck. Thus—at least a part of the first vacuum propagation path moves when the chuck moves.

The vacuum module may be configured to secure the wafer to the chuck, during a wafer straightening period, by applying the first vacuum and the second vacuum.

Alternatively—the vacuum module may be configured to secure the wafer to the chuck, during the wafer straightening period, by applying the second vacuum and not applying the second vacuum.

The vacuum module may be configured to secure the wafer to the chuck, during the wafer straightening period, following a positioning of the chuck in a wafer straightening position.

The vacuum module may be configured to maintain the wafer secured to the chuck while the chuck is departed from the wafer straightening position—for example during a wafer secure maintaining period.

The first vacuum propagation path may be more flexible than the second vacuum propagation path. For example—one or more first vacuum conveying conduits of the first vacuum propagation path may be included in one or more flexible cable braids that follow the movement of the mechanical stage.

For example

Assuming that an evaluation system includes a mechanical stage base that supports a x-axis mechanical stage that supports a y-axis mechanical stage.

The x-axis mechanical stage moves along the x-axis in relation to the mechanical stage base.

One or more first vacuum conveying conduits that extend from the mechanical stage base to the x-axis mechanical stage and even through the x-axis mechanical stage—should follow the movement of the x-axis mechanical stage—and may be flexible—for example may be included in a first flexible cable braid.

The y-axis mechanical stage moves along the y-axis in relation to the x-axis mechanical stage and in relation to the mechanical stage base.

One or more first vacuum conveying conduits that extend from the x-axis mechanical stage to the y-axis mechanical stage and even through the y-axis mechanical stage—should follow the movement of the y-axis mechanical stage—and may be flexible—for example may be included in a second flexible cable braid.

The need to follow the movement of the chuck requires a lengthy first vacuum propagation path. The overall length of the first vacuum propagation path may introduce more vacuum losses than the second vacuum propagation path—and may even prevent the provision of vacuum of a second vacuum level through the first vacuum propagation path.

The vacuum module may be configured to (i) apply the at least first vacuum on the wafer by applying the first vacuum at different first locations of the chuck; and (ii) to apply the at least second vacuum on the wafer by applying the second vacuum at different second locations of the chuck.

There may be any number of first locations. There may be any spatial distribution of the first locations.

There may be any number of second locations. There may be any spatial distribution of the second locations.

There may be any spatial relationship between the first locations and the second locations. For example—the different first locations more distant from a center of the chuck than the different second locations. Yet for another example—at least some of the first locations may not be more distance from the center of the chuck in relation to at least some of the first locations.

FIGS. 1A, 1B, 1C, 1D, 2A, 2B, 3A, 3B, 4A, 4B and 4C illustrates various examples of a system that includes:

- A vacuum module that includes first vacuum source 21, second vacuum source 31, first vacuum conductive path 22 and second vacuum conductive path 35.
- A mechanical stage 16 that includes mechanical stage base 14, a y-axis mechanical stage that includes y-axis rails 12 and y-axis frame 11, an x-axis mechanical stage that includes x-axis rails 13 and x-axis frame 17.
- A controller 50 for controlling the operation of the system.

Figure 1A:
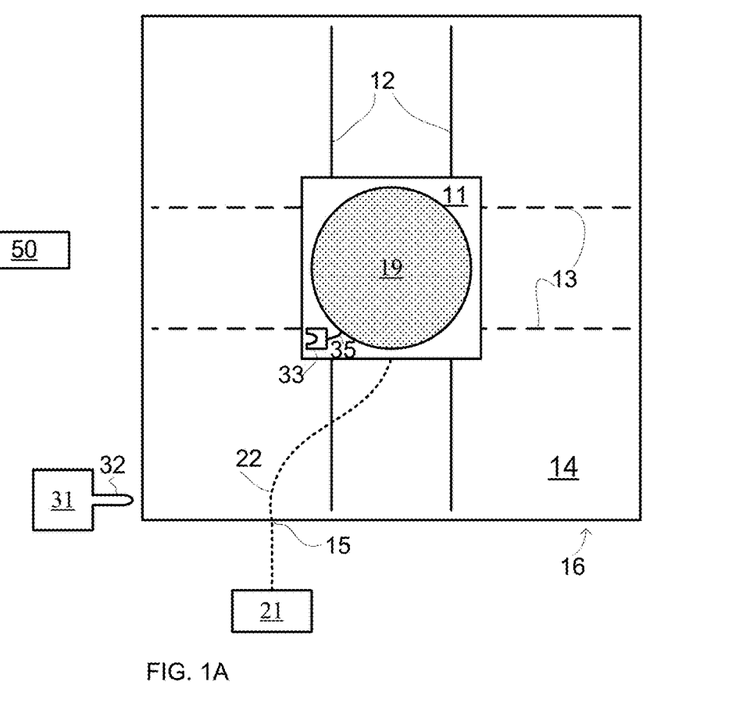
FIG. 1A is an example of one or more parts of a system.
Figure 1B:
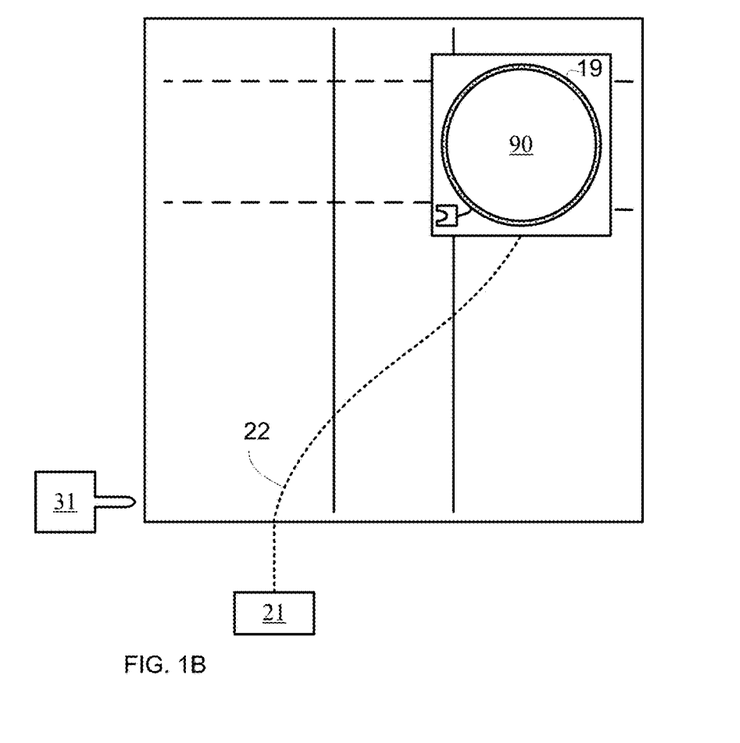
FIG. 1B is an example of one or more parts of a system.

In FIGS. 1A and 1B, the chuck is positioned in different positions that differ from the wafer straightening position. One or more segments of the first vacuum conductive path follow the movement of the chuck.

FIG. 1A also illustrates a mechanical stage port 15 for receiving the first vacuum from the first vacuum source 21. FIG. 1A further illustrates a second vacuum port 33 located on the y-axis frame 11 that moves along with the chuck.

FIG. 1B also illustrates wafer 90 positioned on the y-axis frame 11.

Figure 1C:
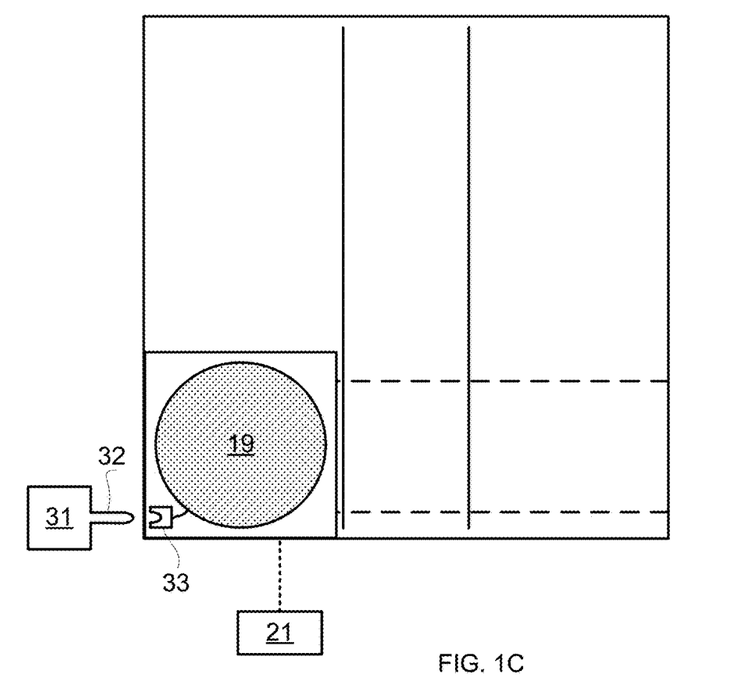
FIG. 1C is an example of one or more parts of a system.
Figure 1D:
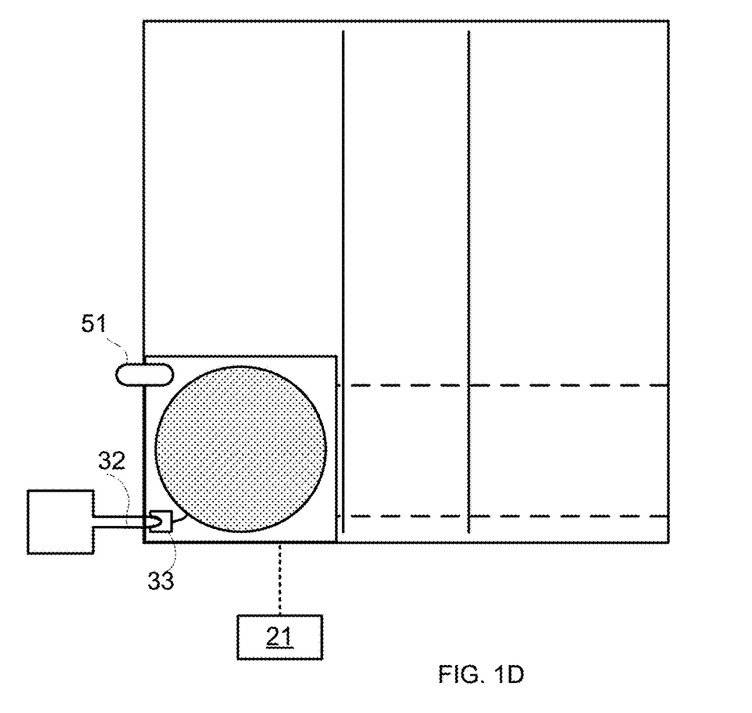
FIG. 1D is an example of one or more parts of a system.

In FIGS. 1C and 1D, the chuck is positioned in the wafer straightening position. In FIG. 1C the second vacuum source is not in fluid communication with the second vacuum port 33.

In FIG. 1D the second vacuum source is in fluid communication with the second vacuum port 33—because second vacuum conduit 32 extends from the second vacuum source 31 towards the second vacuum port 33 to enter the second vacuum port 33. It should be noted that the second vacuum conduit may have a female interface while the second vacuum port 33 may include a male interface. FIG. 1D also illustrates a lock 51 that secures the y-axis frame (or any other part of any of the stages) to another mechanical element.

Figure 2A:
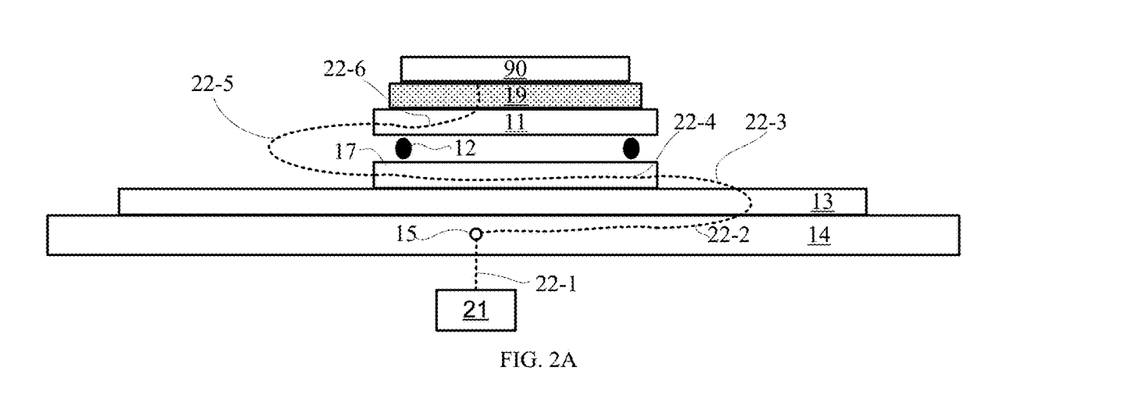
FIG. 2A is an example of one or more parts of a system.
Figure 2B:
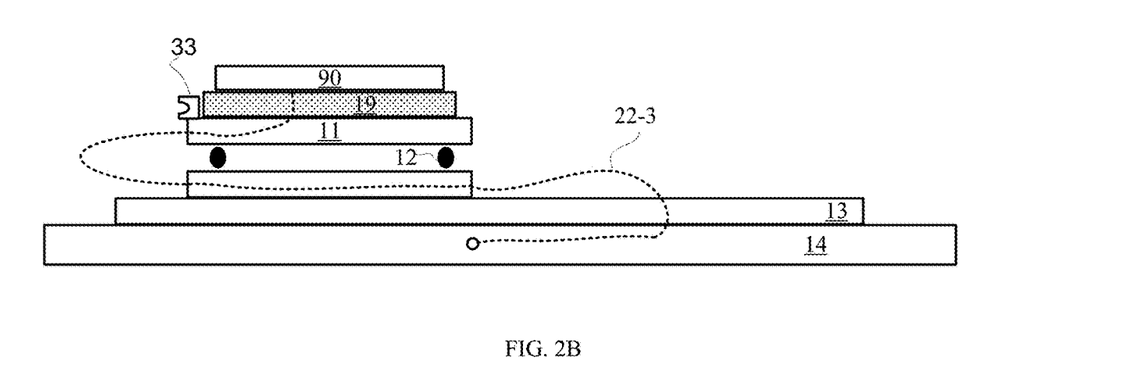
FIG. 2B is an example of one or more parts of a system.

FIGS. 2A and 2B are side views of parts of the system at different positions of the chuck. These figures illustrates some first fluid conduits such as 22-1, 22-2, 22-3, 22-4, 22-5 and 22-6—of which first fluid conduits 22-3 and 22-5 are included in flexible braids.

Figure 3A:
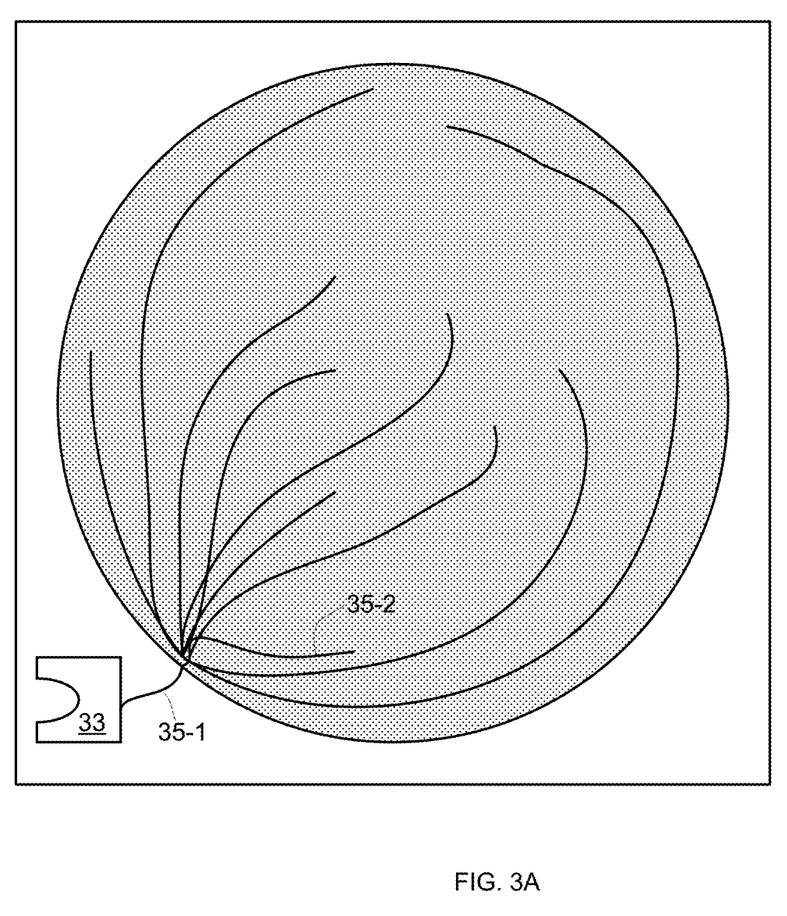
FIG. 3A is an example of one or more parts of a system.

FIG. 3A illustrates examples of various second fluid conduits 35-1 and 35-2.

Figure 3B:
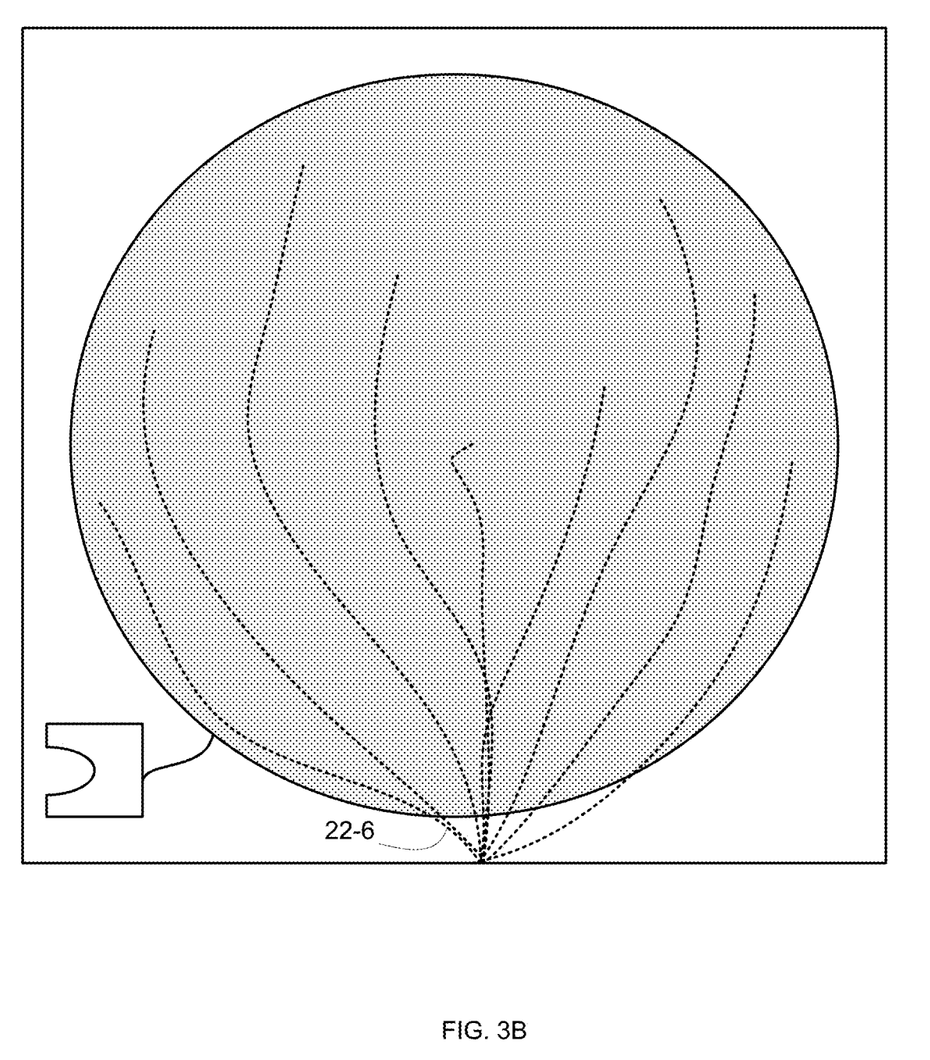
FIG. 3B is an example of one or more parts of a system.

FIG. 3B illustrates examples of various first fluid conduits 22-6.

Figure 4A:
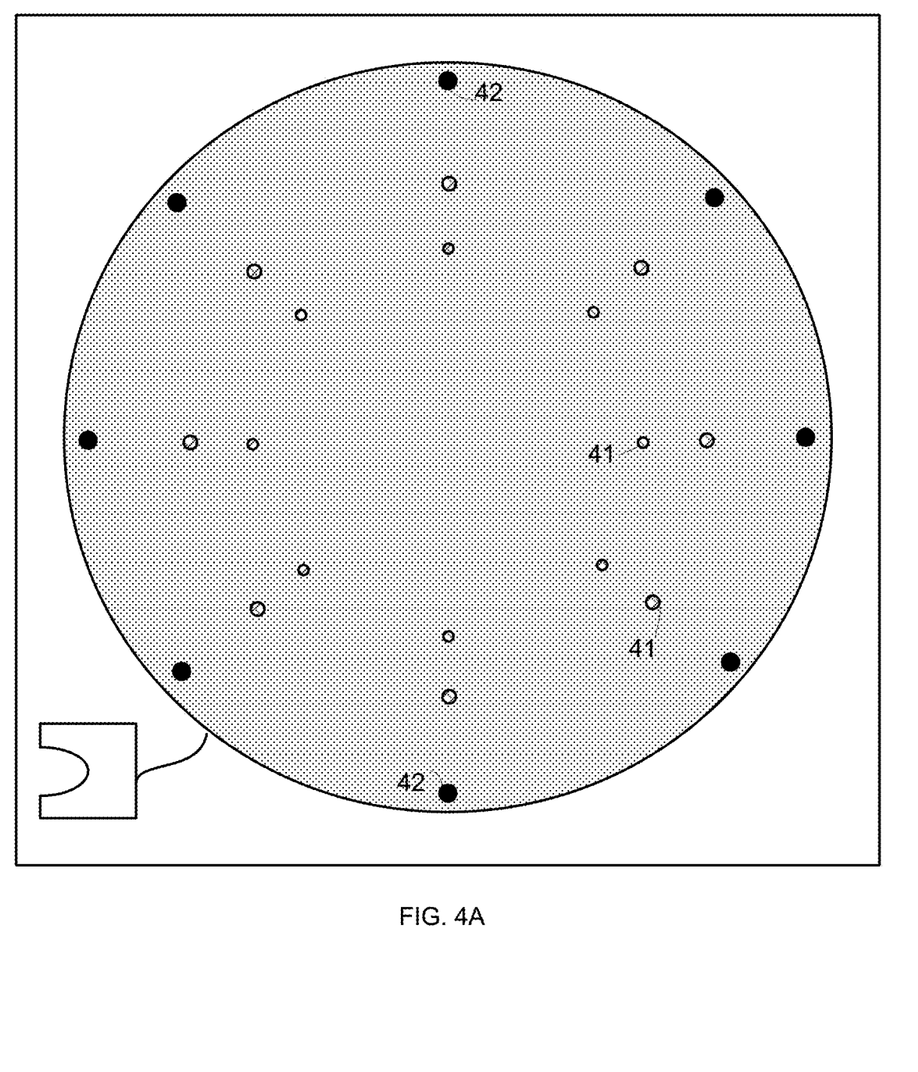
FIG. 4A is an example of one or more parts of a system.
Figure 4B:
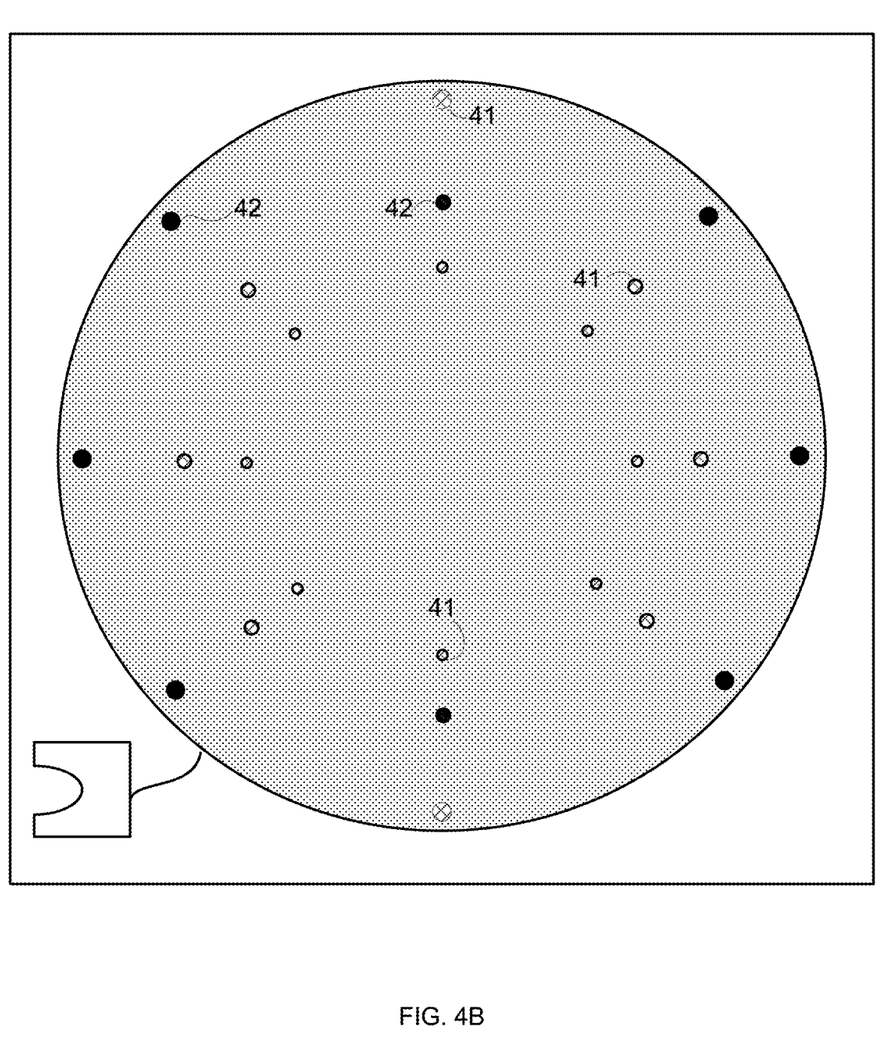
FIG. 4B is an example of one or more parts of a system.
Figure 4C:
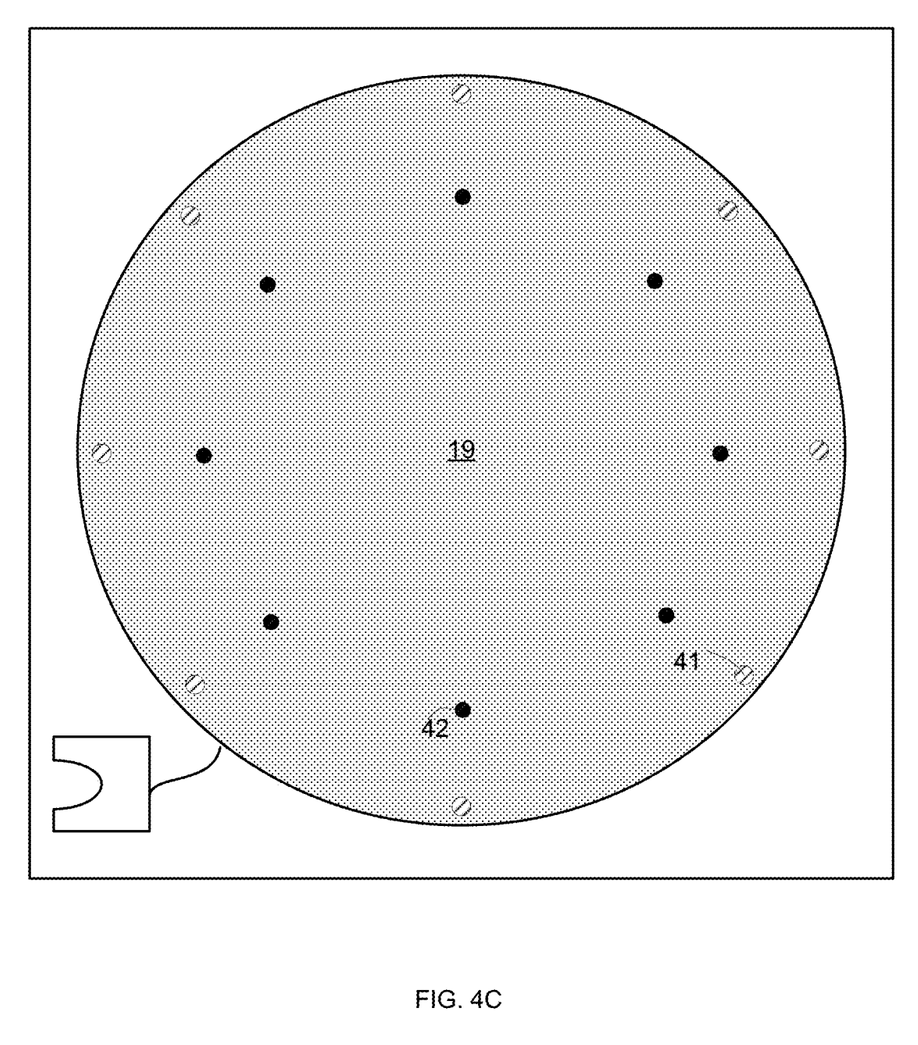
FIG. 4C is an example of one or more parts of a system.

FIGS. 4A, 4B and 4C illustrates various examples of different first chuck openings 41 configured to apply first vacuum on a wafer at different first locations, and of different second chuck openings 42 configured to apply second vacuum on a wafer at different second locations.

The may be any number of first openings and there may be any number of second openings. The first openings are the end point of the first vacuum conductive path. The second openings are the end point of the second vacuum conductive path.

It may be beneficial to straighten a wafer by applying vacuum (first vacuum and/or second vacuum) in a gradual manner—starting from points that are located closer to the center of the wafer—and then continuing to apply vacuum at points that are closer to the end of the wafer. It should be noted that the provision of vacuum can be executed in any other order.

Figure 5:
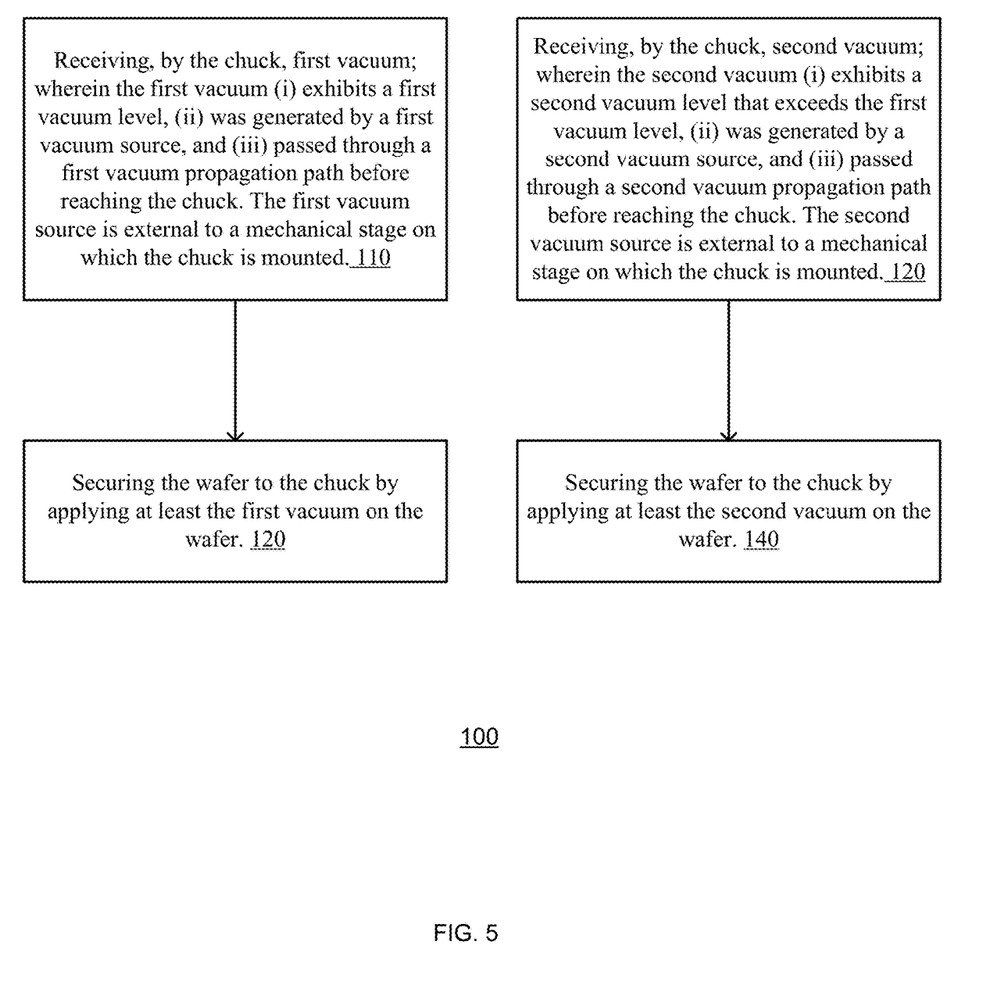
FIG. 5 is an example of a system.

FIG. 5 illustrates an example of a method 100.

Method 100 may include various steps—and the steps may be executed in any order and/or with any timing overlap—or without any timing overlap.

Method 100 may include step 110 of receiving, by the chuck, first vacuum; wherein the first vacuum (i) exhibits a first vacuum level, (ii) was generated by a first vacuum source, and (iii) passed through a first vacuum propagation path before reaching the chuck. The first vacuum source is external to a mechanical stage on which the chuck is mounted.

Step 110 may be followed by step 120 of securing the wafer to the chuck by applying at least the first vacuum on the wafer.

Step 120 may include applying the first vacuum at different first locations of the chuck.

Method 100 may include step 130 of receiving, by the chuck, second vacuum; wherein the second vacuum (i) exhibits a second vacuum level that exceeds the first vacuum level, (ii) was generated by a second vacuum source, and (iii) passed through a second vacuum propagation path before reaching the chuck. The second vacuum source is external to the mechanical stage.

The first vacuum propagation path follows movements of the chuck. The second vacuum propagation path remains static despite the movements of the chuck.

Step 130 may be followed by step 140 of securing the wafer to the chuck by applying at least the second vacuum on the wafer.

Step 140 may include applying the second vacuum at different second locations of the chuck.

Step 110 may precede step 130. Step 110 may follow step 130. Step 110 and 130 may be executed concurrently or in a partially overlapping manner.

One or more steps of method 100 may be executed during a wafer straightening period in which a wrapped wafer is at least partially straightened to provide a straighten wafer.

The wafer straightening period may be followed by a wafer secure maintaining period in which the wafer is secured to the chuck while the wafer is in a straightened state.

One or more steps of method 100 may be executed during the wafer secure maintaining period.

The vacuum level applied during the wafer straightening period may exceed the vacuum level applied during the wafer secure maintaining period.

For example—steps 110 and 120 may be executed during the wafer secure maintaining period.

Yet for another example—steps 130 and 140 may be executed during the wafer straightening period—either alone or in combination with steps 120 and 130.

Steps 130 and 140 may be executed during the wafer straightening period—while the chuck is positioned, by a mechanical stage, in a wafer straightening position Steps 110 and 120 may be executed during the wafer secure maintaining period—even when the chuck is departed from the wafer straightening position.

Method 100 may include generating the first vacuum and/or generating the second vacuum and/or moving the chuck to any location or position.

Method 100 may be executed by any of the system illustrated above—and/or in any figures of FIGS. 1A-1D, 2A-2B, 3A-3B and 4A-4C.

Figure 6:
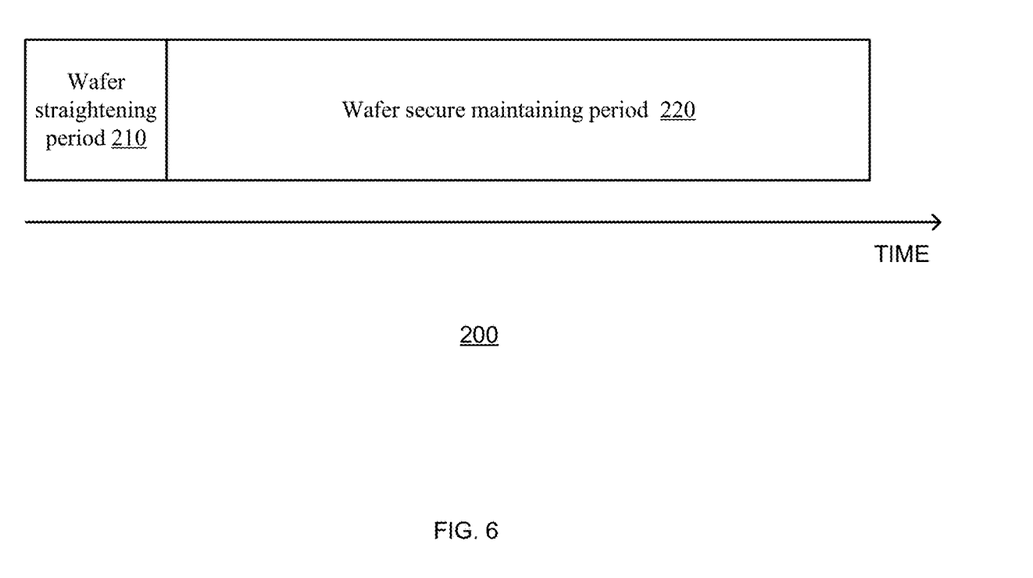
FIG. 6 is an example of a timing diagram.

FIG. 6 is a timing diagram 200—that illustrates a wafer straightening period 210 followed by a wafer secure maintaining period 220.

In the foregoing specification, the embodiments of the disclosure has been described with reference to specific examples of embodiments of the disclosure. It will, however, be evident that various modifications and changes may be made therein without departing from the broader spirit and scope of the embodiments of the disclosure as set forth in the appended claims.

Moreover, the terms "front," "back," "top," "bottom," "over," "under" and the like in the description and in the claims, if any, are used for descriptive purposes and not necessarily for describing permanent relative positions. It is understood that the terms so used are interchangeable under appropriate circumstances such that the embodiments of the disclosure described herein are, for example, capable of operation in other orientations than those illustrated or otherwise described herein.

The connections as discussed herein may be any type of connection suitable to transfer signals from or to the respective nodes, units or devices, for example via intermediate devices. Accordingly, unless implied or stated otherwise, the connections may for example be direct connections or indirect connections. The connections may be illustrated or described in reference to be a single connection, a plurality of connections, unidirectional connections, or bidirectional connections. However, different embodiments may vary the implementation of the connections. For example, separate unidirectional connections may be used rather than bidirectional connections and vice versa. Also, plurality of connections may be replaced with a single connection that transfers multiple signals serially or in a time multiplexed manner. Likewise, single connections carrying multiple signals may be separated out into various different connections carrying subsets of these signals. Therefore, many options exist for transferring signals.

Any arrangement of components to achieve the same functionality is effectively "associated" such that the desired functionality is achieved. Hence, any two components herein combined to achieve a particular functionality may be seen as "associated with" each other such that the desired functionality is achieved, irrespective of architectures or intermedial components. Likewise, any two components so associated can also be viewed as being "operably connected," or "operably coupled," to each other to achieve the desired functionality.

Furthermore, those skilled in the art will recognize that boundaries between the above described operations merely illustrative. The multiple operations may be combined into a single operation, a single operation may be distributed in additional operations and operations may be executed at least partially overlapping in time. Moreover, alternative embodiments may include multiple instances of a particular operation, and the order of operations may be altered in various other embodiments.

Also for example, in one embodiment, the illustrated examples may be implemented as circuitry located on a single integrated circuit or within a same device. Alternatively, the examples may be implemented as any number of separate integrated circuits or separate devices interconnected with each other in a suitable manner.

However, other modifications, variations and alternatives are also possible. The specifications and drawings are, accordingly, to be regarded in an illustrative rather than in a restrictive sense.

In the claims, any reference signs placed between parentheses shall not be construed as limiting the claim. The word 'comprising' does not exclude the presence of other elements or steps then those listed in a claim. Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to embodiments of the disclosure s containing only one such element, even when the same claim includes the introductory phrases "one or more" or "at least one" and indefinite articles such as "a" or "an." The same holds true for the use of definite articles. Unless stated otherwise, terms such as "first" and "second" are used to arbitrarily distinguish between the elements such terms describe. Thus, these terms are not necessarily intended to indicate temporal or other prioritization of such elements. The mere fact that certain measures are recited in mutually different claims does not indicate that a combination of these measures cannot be used to advantage.

While certain features of the embodiments of the disclosure have been illustrated and described herein, many modifications, substitutions, changes, and equivalents will now occur to those of ordinary skill in the art. It is, therefore, to be understood that the appended claims are intended to cover all such modifications and changes as fall within the true spirit of the embodiments of the disclosure.

We claim:

1. A system for securing a wafer to a chuck, the system comprises:
   a vacuum module that comprises a first vacuum source, a first vacuum propagation path, a second vacuum source, and a second vacuum propagation path;
   wherein the first vacuum source is configured to provide first vacuum of a first vacuum level, via the first vacuum propagation path, to a chuck that is mounted on a mechanical stage; wherein the first vacuum source is external to the mechanical stage;
   wherein the second vacuum source is configured to provide second vacuum at a second vacuum level, via the second vacuum propagation path, to the chuck; wherein the second vacuum source is external to the mechanical stage; wherein the second vacuum level exceeds the first vacuum level;
   wherein the chuck is configured to apply at least one of the first vacuum or the second vacuum to the wafer; and
   wherein the first vacuum propagation path is configured to follow movements of the chuck, wherein the second vacuum propagation path is configured to remain static despite the movements of the chuck.

2. The system according to claim 1, wherein the vacuum module is configured to secure the wafer to the chuck, during a wafer straightening period, by applying the first vacuum and the second vacuum.

3. The system according to claim 2, wherein the vacuum module is configured to secure the wafer to the chuck, during the wafer straightening period, following a positioning of the chuck in a wafer straightening position.

4. The system according to claim 3, wherein the vacuum module is configured to maintain the wafer secured to the chuck while the chuck is departed from the wafer straightening position.

5. The system according to claim 1, wherein the vacuum module is configured to secure the wafer to the chuck, during a wafer straightening period, by applying the second vacuum without applying the first vacuum.

6. The system according to claim 1, wherein the first vacuum propagation path is more flexible than the second vacuum propagation path.

7. The system according to claim 1, wherein the vacuum module is configured to (i) apply the at least first vacuum on the wafer by applying the first vacuum at different first locations of the chuck; and (ii) apply the at least second vacuum on the wafer by applying the second vacuum at different second locations of the chuck.

8. The system according to claim 7 wherein the different first locations are more distant from a center of the chuck than the different second locations.

9. The system according to claim 1, wherein the first vacuum propagation path is longer than the second vacuum propagation path.

10. The system according to claim 1, wherein the first vacuum propagation path exhibits a larger vacuum loss than the second vacuum propagation path.

11. A method for securing a wafer to a chuck, the method comprises:
receiving, by the chuck, first vacuum; wherein the first vacuum (i) exhibits a first vacuum level, (ii) was generated by a first vacuum source, and (iii) passed through a first vacuum propagation path before reaching the chuck; wherein the first vacuum source is external to a mechanical stage on which the chuck is mounted;
securing the wafer to the chuck by applying at least the first vacuum on the wafer;
receiving, by the chuck, second vacuum; wherein the second vacuum (i) exhibits a second vacuum level that exceeds the first vacuum level, (ii) was generated by a second vacuum source, and (iii) passed through a second vacuum propagation path before reaching the chuck; wherein the second vacuum source is external to the mechanical stage; and
securing the wafer to the chuck by applying at least the second vacuum on the wafer; and
wherein the first vacuum propagation path follows movements of the chuck, wherein the second vacuum propagation path remains static despite the movements of the chuck.

12. The method according to claim 11, comprising securing the wafer to the chuck, during a wafer straightening period, by applying the first vacuum and the second vacuum.

13. The method according to claim 12, comprising positioning, by the mechanical stage, the chuck in a wafer straightening position during the wafer straightening period.

14. The method according to claim 13, comprising maintaining the wafer secured to the chuck while the chuck is departed from the wafer straightening position.

15. The method according to claim 11, comprising securing the wafer to the chuck, during wafer straightening period, by applying the second vacuum without applying the first vacuum.

16. The method according to claim 11, wherein the first vacuum propagation path is more flexible than the second vacuum propagation path.

17. The method according to claim 11, wherein the applying of the at least first vacuum on the wafer comprises applying the first vacuum at different first locations of the chuck; wherein the applying of the at least second vacuum on the wafer comprises applying the second vacuum at different second locations of the chuck.

18. The method according to claim 17, wherein the different first locations may be more distant from a center of the chuck than the different second locations.

19. The method according to claim 11, wherein the first vacuum propagation path is longer than the second vacuum propagation path.

* * * * *